(12) United States Patent
Yoo

(10) Patent No.: US 7,251,015 B2
(45) Date of Patent: Jul. 31, 2007

(54) PHOTOLITHOGRAPHY MASK CRITICAL DIMENSION METROLOGY SYSTEM AND METHOD

(75) Inventor: Chiu-Shan Yoo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/167,776

(22) Filed: Jun. 27, 2005

(65) Prior Publication Data
US 2006/0290907 A1  Dec. 28, 2006

(51) Int. Cl.
*G03B 27/68* (2006.01)
*G03B 27/42* (2006.01)

(52) U.S. Cl. .............................. 355/52; 355/53

(58) Field of Classification Search ............... 355/52, 355/53, 55, 67; 356/237.2, 237; 700/59
See application file for complete search history.

(56) References Cited

U.S. PATENT DOCUMENTS

| 4,958,074 A | 9/1990 | Wolf et al. |
| 6,510,730 B1 | 1/2003 | Phan et al. |
| 6,622,547 B1 | 9/2003 | Phan et al. |
| 6,760,473 B1 | 7/2004 | Fiekowsky |
| 6,803,554 B2 * | 10/2004 | Ye et al. ............... 250/208.1 |
| 7,027,143 B1 * | 4/2006 | Stokowski et al. ...... 356/237.2 |
| 2004/0133369 A1 * | 7/2004 | Pack et al. ................ 702/59 |

OTHER PUBLICATIONS

Kasprowicz, Bryan et al., "Integrating a CD SEM into an optical system for photomask metrology operations", 12 pages, www.micromagazine.com/archive/00/02/kasprowiez.html.

* cited by examiner

Primary Examiner—Henry Hung Nguyen
(74) Attorney, Agent, or Firm—Haynes and Boone, LLP

(57) ABSTRACT

A photolithography mask critical dimension metrology system is provided. The system includes a radiation source, a holder operable to securely hold at least one mask oriented to receive radiation emitted from the radiation source, a projection system operable to direct radiation passing through the at least one mask, and an image capture system operable to receive radiation directed by the projection system and capture a projected image of the at least one mask.

17 Claims, 1 Drawing Sheet

PHOTOLITHOGRAPHY MASK CRITICAL DIMENSION METROLOGY SYSTEM AND METHOD

BACKGROUND

Optical proximity correction (OPC) is a term used to refer to a collection of techniques used to correct distortions in sub-wavelength photolithography. These distortions include line width variations, shortening of lines, and rounding of corners that are dependent on pattern density and other proximity factors. OPC is used to alter the photomask geometries to anticipate and compensate for these proximity effects. Typically, a photolithography mask is designed according to circuit geometries and layout, and then its geometries are modified in an OPC step. The OPC-modified photomask pattern comprises "serifs" added to line corners, "jogs" or extensions added to line-ends, and other OPC features that generally increase the non-linearity of the mask pattern.

Although OPC has been an important technique to compensate for optical proximity effects, it also has introduced difficulties in another area of photomask production. The successful manufacture of these masks requires the detection, measurement and evaluation of defects on the photomasks. However, the OPC features added to the photomask pattern has made the mask verification process very difficult. Conventional metrology tools are designed to measure the distance between line edges. If the edges are irregular curves, making edge-to-edge measurement becomes a challenge task. For example, some metrology tools require an edge used in measurements to be a straight edge of at least 2 µm long. Because of the added OPC features, this requirement is difficult to satisfy for the number of measurements needed for mask verification.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
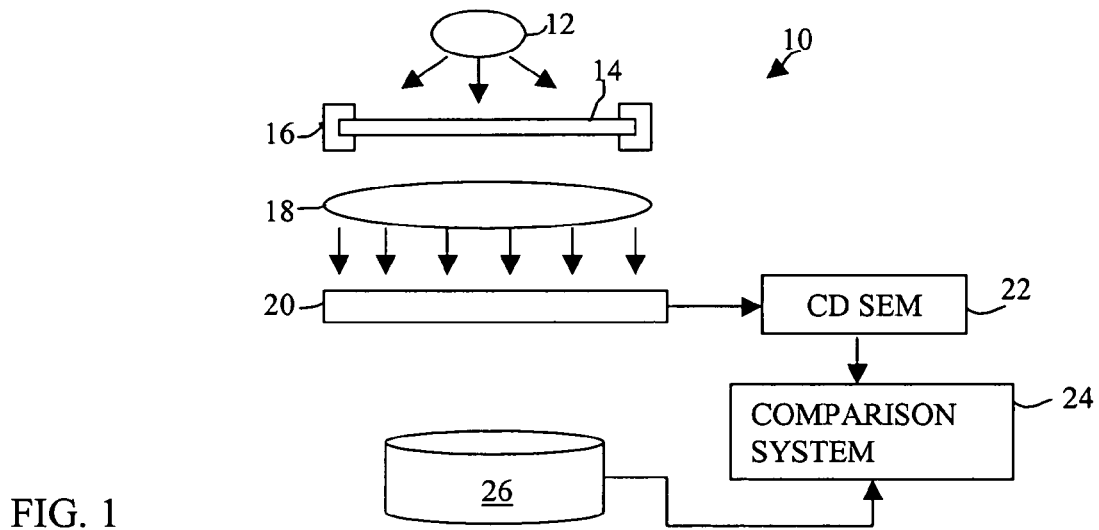
FIG. 1 is a simplified schematic diagram of an embodiment of a system for photolithography mask critical dimension measurement.

FIG. 1 is a simplified schematic diagram of an embodiment of a system 10 for photolithography mask critical dimension measurement. System 10 comprises a radiation source 12 that may emit visible light, ultraviolet (UV), deep ultraviolet (DUV), extreme ultraviolet (EUV), X-ray, or radiation in other suitable spectra. A mask 14 that has been modified after optical proximity correction or OPC is placed on a mask holding stage or held by a mask holder 16. Mask holder 16 is operable to hold one or more masks. The mask 14 is positioned over a projection system 18 that may include one or more lenses, for example. The projection system 18 is operable to direct radiation passing through the mask 14. An image capture system 20 is positioned proximately to projection system 18. The image capture system 20 is operable to receive radiation directed by the projection system 18 and capture a projected image of the mask 14. Image capture system 20 may comprise an array of sensors such as CCD (charge-coupled device) image sensors, CMOS (complimentary metal-oxide semiconductor) image sensors, and other suitable image sensors. Alternately, image capture system 20 may be a photoresist that is operable to receive a transfer of the pattern from OPC mask 14.

The radiation source 12, mask holder 16, and projection system 18, as well as the general setup and distances between the components shown in FIG. 1 should be identical or very similar to that used during photolithography using the OPC mask to transfer the pattern thereon to a wafer or the photoresist on a wafer during integrated circuit manufacture. Alternatively, the same tool or system for photolithography during integrated circuit fabrication may be used for critical dimension metrology as described herein.

A tool such as a critical dimension scanning electron microscope (CD SEM) 22 or another suitable tool may be used to make critical dimension measurements of projected image at a predetermined number of points on mask 14. These predetermined number of points are preferably previously identified by given X- and Y-coordinates, for example. CD measurement tool 22 is coupled to a comparison tool or system 24. The predetermined number of OPC mask critical dimension measurements are compared, by system 24, with the same critical dimension measurements of the mask prior to the OPC step stored in a database 26, for example. System 24 may comprise a microprocessor, a computer or another suitable processing device.

Figure 2:
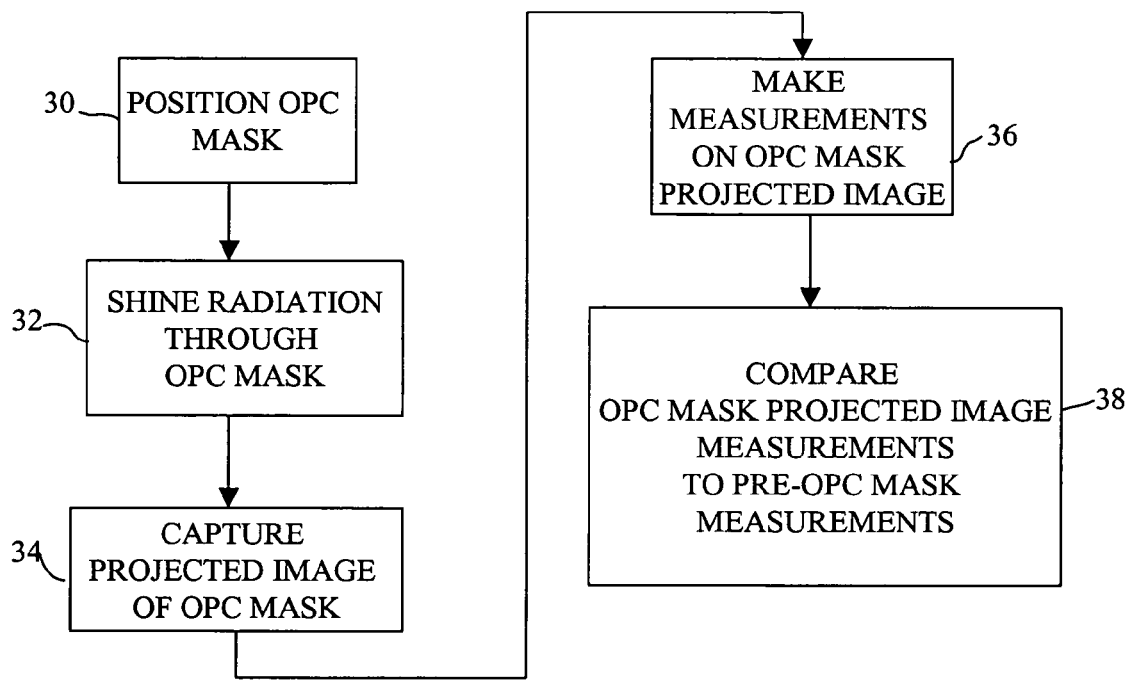
FIG. 2 is a simplified flowchart of an embodiment of a method for photolithography mask critical dimension measurement.

FIG. 2 is a simplified flowchart of an embodiment of a method for photolithography mask critical dimension measurement. In step 30, one or more masks 14 are put into position either on a stage or held in a holder 16 (FIG. 1). In step 32, light or radiation is directed through OPC mask 14 and further directed by projecting system 18 onto image capture system 20. In step 34, image capture system 20 receives the projected or aerial image of the OPC-modified patterns of the mask and captures as electrical signals. This projected image is used by a measurement tool such as a CD SEM 22 to make a predetermined number of critical dimension measurements at predetermined locations of the projected image in step 36. Because the aerial image (either captured by sensors or by photoresist) of the OPC mask lacks the serifs and jogs, customary methods of taking critical dimension measurements may be used. The OPC mask projected image critical dimension measurements are then provided to a comparison system 24, which compares the OPC mask measurements with the critical dimension measurements of a pre-OPC mask stored in a database 26 in step 38. The database 26 comprises Graphic Design System (GDS) data. The database 26 comprises an image file of GDS data. The OPC mask should generate an projected image that is very similar or identical to the mask prior to the addition of OPC features. Therefore, any critical dimension measurement difference between the OPC mask projected image and the pre-OPC mask may be used to verify and correct the mask.

It may be seen that, instead of making critical dimension measurements of an OPC mask, which includes OPC features such as serifs and jogs, the measurements are instead made on a projected image of the OPC mask. Such projected image lacks the serifs, jogs and other non-linear OPC features. Therefore, the critical dimension measurement and verification tasks become possible for semiconductor wafer manufacturing.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims.

What is claimed is:

1. A system comprising:
   a radiation source;
   a holder operable to securely hold at least one mask modified by optical proximity correction (OPC), the at least one mask is oriented to receive radiation emitted from the radiation source;
   a projection system operable to direct radiation passing through the at least one mask; and
   an image capture system operable to receive radiation directed by the projection systems, capture a projected image of the at least one mask, and make critical dimension measurements of the projected image at a plurality of locations; and
   a comparison system operable to compare critical dimension measurements of the projected image with a set of known corresponding critical dimension measurements from the at least one mask before being modified by OPC.

2. The system of claim 1, wherein the image capture system comprises an array of image sensors.

3. The system of claim 1, wherein the image capture system comprises an array of charge-coupled device image sensors.

4. The system of claim 1, wherein the image capture system comprises an array of complimentary metal-oxide semiconductor image sensors.

5. The system of claim 1, wherein the image capture system comprises a photoresist.

6. The system of claim 1, wherein the projection system comprises at least one lens.

7. The system of claim 1, wherein the at least one mask comprises optical proximity correction features.

8. The system of claim 1, further comprising a critical dimension measurement tool.

9. The system of claim 8, wherein the critical dimension measurement tool comprises a scanning electron microscope.

10. The system of claim 1, wherein the radiation sources is selected from the group consisting of a visible light source, a ultraviolet light source, a deep ultraviolet light source, an extreme ultraviolet light source, and an X-ray source.

11. A method comprising:
    directing a radiation through an OPC mask and generating a projected image of the mask;
    capturing the projected image;
    making a predetermined number of critical dimension measurements at selected locations of the projected image; and
    comparing the projected image critical dimension measurements to a set of known corresponding critical dimension measurements of a pre-OPC mask.

12. The method of claim 11, wherein directing radiation comprises directing a radiation selected from a group consisting of visible light, ultraviolet light, deep ultraviolet light, extreme ultraviolet light, and X-ray.

13. The method of claim 11, wherein capturing the projected image comprises capturing the projected image using an array of image sensors.

14. The method of claim 11, wherein capturing the projected image comprises capturing the projected image using a photoresist.

15. The method of claim 11, further comprising positioning at least one mask between a radiation source and a projection system operable to direct the radiation.

16. The method of claim 11, further comprising generating a difference in critical dimensions between the projected image critical dimension measurements to the set of known corresponding critical dimension measurements.

17. A system comprising:
    a radiation source;
    at least one mask having a pattern that has been modified by OPC;
    a holder operable to securely hold the at least one mask oriented to receive radiation emitted from the radiation source;
    a projection system operable to direct radiation passing through the at least one mask;
    an array of image sensors operable to receive radiation directed by the projection system and capture a projected image of the at least one mask;
    a critical dimension measurement tool operable to measure critical dimensions at a predetermined number of selected locations on the projected image; and
    a comparator operable to compare the critical dimension measurements of the projected image with a set of known corresponding critical dimension measurements from a same pattern that has not been modified by OPC.

* * * * *